United States Patent [19]
Costlow et al.

[11] Patent Number: 4,868,524
[45] Date of Patent: Sep. 19, 1989

[54] RF CIRCUIT UTILIZING A VOLTAGE CONTROLLED SAW OSCILLATOR

[75] Inventors: Raymond J. Costlow, Baltimore; Alvin G. Bates, Clarksville, both of Md.

[73] Assignee: The Johns Hopkins University, Baltimore, Md.

[21] Appl. No.: 260,223

[22] Filed: Oct. 20, 1988

[51] Int. Cl.$^4$ .......................... H03L 7/01; H03L 7/18
[52] U.S. Cl. ........................................ 331/16; 331/25; 331/176
[58] Field of Search ............ 331/9, 16, 18, 25, 107 A, 331/176

[56] References Cited
U.S. PATENT DOCUMENTS 4,325,032  4/1982  Gilden ..................... 331/107 A X Primary Examiner—David Mis
Attorney, Agent, or Firm—Robert E. Archibald; Howard W. Califano

[57] ABSTRACT

An RF circuit to generate a stable carrier signal using a Voltage Controlled Saw Oscillator (VCSO) is disclosed. The invention teaches the use of a phase lock loop circuit employing a temperature compensated crystal oscillator (TCXO), or similar stable oscillator, to stabilize the output of the VCSO.

6 Claims, 2 Drawing Sheets

RF CIRCUIT UTILIZING A VOLTAGE CONTROLLED SAW OSCILLATOR

STATEMENT OF GOVERNMENTAL INTEREST

The Government has rights in this invention pursuant to Contract No. N00039-87-C-5301 awarded by the Department of the Navy.

BACKGROUND OF THE INVENTION

1. Field of the Invention

This invention relates to an improved RF (radio frequency) circuit that can be used in various transmitters. In particular, the invention relates to a method and apparatus for frequency stabilizing a Voltage Controlled SAW oscillator (VCSO) so that it can generate a stable RF carrier signal.

2. Description of the Prior or Contemporary Art

It has been recognized in the art that Voltage Controlled SAW Oscillators (VCSO) have an unstable output frequency, caused by age and thermal effects, which make them inappropriate for use as RF carrier oscillators. The following patents teach prior art techniques for correcting such frequency instability:

U.S. Pat. No. 4,011,526, issued to Kinsman, compensates for the parabolic temperature frequency drift characteristic of a surface acoustic wave (SAW) oscillator. The Kinsman apparatus includes a pair of varactor diodes and a temperature sensitive voltage supply. The diodes are connected in series and coupled to the SAW oscillator. The varactor diode's capacitance versus temperature characteristic provides a parabolic output signal. The parabolic output signal is used to compensate for the thermal drift of the SAW resonator.

U.S. Pat. No. 4,338,575, issued to Hartman, teaches a technique to compensate for temperature variations by coupling SAW resonators. A transmission line delay that varies with temperature is coupled to one of the SAW oscillators.

U.S. Pat. No. 4,193,045, issued to Houkawa et al, teaches the use of a parallel arrangement of SAW oscillators. Each SAW oscillator has a different oscillation frequency and a different turnover temperature so that a small frequency deviation occurs with temperature changes.

U.S. Pat. No. 4,489,289, issued to Slobodnick et al, uses a look-up table stored in an EPROM to provide frequency corrections to the SAW oscillator circuit. A temperature sensitive circuit decides what values to choose.

U.S. Pat. No. 4,639,697, issued to Yarranton et al teaches temperature compensation of a SAW oscillator by using passive and electronic phase shifters. The electronic phase shifter provides a phase shift as a function of temperature to compensate for instability of the SAW oscillator.

SUMMARY OF THE INVENTION

The present inventors discovered a novel means for temperature compensating a voltage controlled SAW oscillator (VCSO), so that it could be used in an RF circuit. The invented RF circuit comprises a phase lock loop circuit employing a temperature compensated crystal oscillator (TCXO), or similar stable oscillator, to stabilize the output of the VCSO.

The invented RF circuit comprises:

a voltage controlled SAW oscillator (VCSO) having a control voltage input and producing an RF output signal;

a reference oscillator for providing an output having a frequency that is essentially temperature stable; and, a phase locked loop means for comparing the frequency and phase of the output signal from said voltage controlled SAW oscillator (VCSO) with the frequency and phase of the output from said reference oscillator and providing control voltage to the input of said voltage controlled SAW oscillator (VCSO) so as to maintain the RF output signal at a preselected stable frequency.

The phase locked loop means generally contains a control circuit that divides the output frequency from the reference oscillator and from the voltage controlled SAW oscillator (VCSO). The resulting frequency divided outputs are fed to a phase comparator. The phase comparator generates the proper control voltage for the VCSO so that a stable RF carrier output is produced. By controlling the divide ratios, the invented circuit provides a means for adjusting the frequency of the RF carrier output.

Although the invented RF circuit has general utility, it will be discussed with application to a search and rescue transmitter for use with the SARSAT satellite system.

A first novel feature of the invention is the use of a phase lock loop means to frequency stabilize the RF output from a SAW oscillator to the frequency of a temperature stable independent clock, thereby correcting the SAW oscillator for drift and temperature effects.

A second novel feature is the use of a phase lock loop control circuit that adjusts the RF output frequency by digitally controlling the divide ratio of frequency dividers connected to the output of the reference oscillator and the output of the voltage controlled SAW oscillator (VCSO).

BRIEF DESCRIPTION OF THE DRAWINGS

Figure 1:
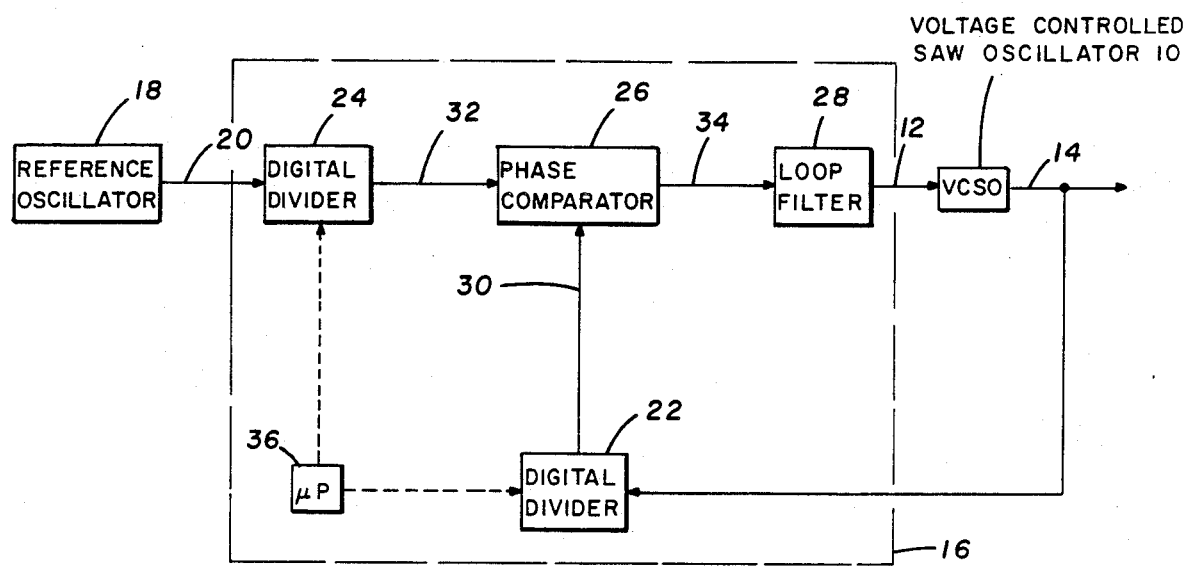
FIG. 1 is a block diagram of the RF circuit as taught by the present invention.

FIG. 1 is a block diagram of the invented RF circuit. A voltage controlled SAW oscillator (VCSO) 10, contains a control voltage input 12 and produces a RF frequency output 14. Adjusting the control voltage 12 causes a proportionate change in the frequency of the RF carrier signal 14. The disadvantage of using a voltage controlled SAW oscillator (VCSO) in an RF circuit is that it is subject to drift and frequency instability caused by thermal effects. However, the invented circuit provides stability by using a phase lock loop 16 tied to an independent reference oscillator 18. The reference oscillator 18 provides an output not affected by temperature changes and can be, by way of non-limiting examples, a temperature controlled crystal oscillator (using an oven), or a temperature compensated crystal oscillator (TCXO). The phase locked loop 16 compares the RF output frequency 14 with the output from the reference oscillator 20 and adjusts the control voltage 12 to the VCSO 10.

The phase lock loop 16 comprises: a first digital frequency divider 22; a second digital frequency divider 24; a phase comparator 26; and a loop filter 28. The first digital filter divider 22 receives as input the RF carrier signal 14 and produces an output 30 that is frequency divided by a preselected integer $N_1$. The second frequency divider 24 receives as input the clocking signal 20 from the reference oscillator and provides an output 32 that is frequency divided by a preselected integer $N_2$. Phase comparator 26 compares the frequency and phase of the outputs from the first and the second frequency dividers (lines 30, 32) and provides an adjusted D.C. control voltage 34. The D.C. control voltage passes through loop filter 28 before it is inputted to the VCSO 10. Loop filter 28 sets the rate at which the control voltage 12 can be adjusted.

In operation, the reference oscillator 18, such as a temperature compensated oscillator (TCXO), stabilizes the RF output frequency of the voltage control SAW oscillator (VCSO) 10. The TCXO is known to provide a stable output frequency, and the VCSO is known to experience frequency drift due to temperature changes and age. Digital frequency dividers 22, 24 may be programmed and can be used to either "trim" the RF circuit or provide RF frequency tuning. Generally, each digital frequency divider contains memory, such as a Random Access Memory (RAM), that stores the frequency divide number. By adjusting the integer frequency divide number stored in the RAM, one can: (1), vary the RF output frequency—i.e., change transmission channel, and/or (2) if the TCXO is slightly off frequency from its specification, an adjustment of the stored integer can "trim" the circuit. The result of adjusting the integer frequency divide numbers causes control voltage to the VCSO to be shifted and therefore the output frequency to be shifted. This feature provides significant versatility in frequency selection. The frequency can be adjusted to any value within the bandwidth of the SAW resonator (outside the bandwidth the gain is reduced.) Also, instead of loading each RAM at the factory, the RAM could be down loaded from a microprocessor 36 that is located in the transmitter. This feature allows frequency agility and the RF circuit could be used for frequency hopping.

Similarly, this RF circuit is very flexible because it can accommodate different reference oscillator frequencies and different output frequencies with only a change in the division numbers stored in each RAM. For example, if the RF circuit is to generate a carrier at 406.025 MHz for the SARSAT satellite system (Search and Rescue) and if the reference oscillator was operated at 10 MHz, the divide number stored in the first frequency divider would be 16241 and in the second frequency divider would be 400. If the RF circuit were designed to operate with the ARGOS satellite system, carried at 401.65 MHz, a VCSO operating in that output range would be selected and the divide number stored in the first frequency divider would be 16066 and the second frequency divider would be 400.

Figure 2:
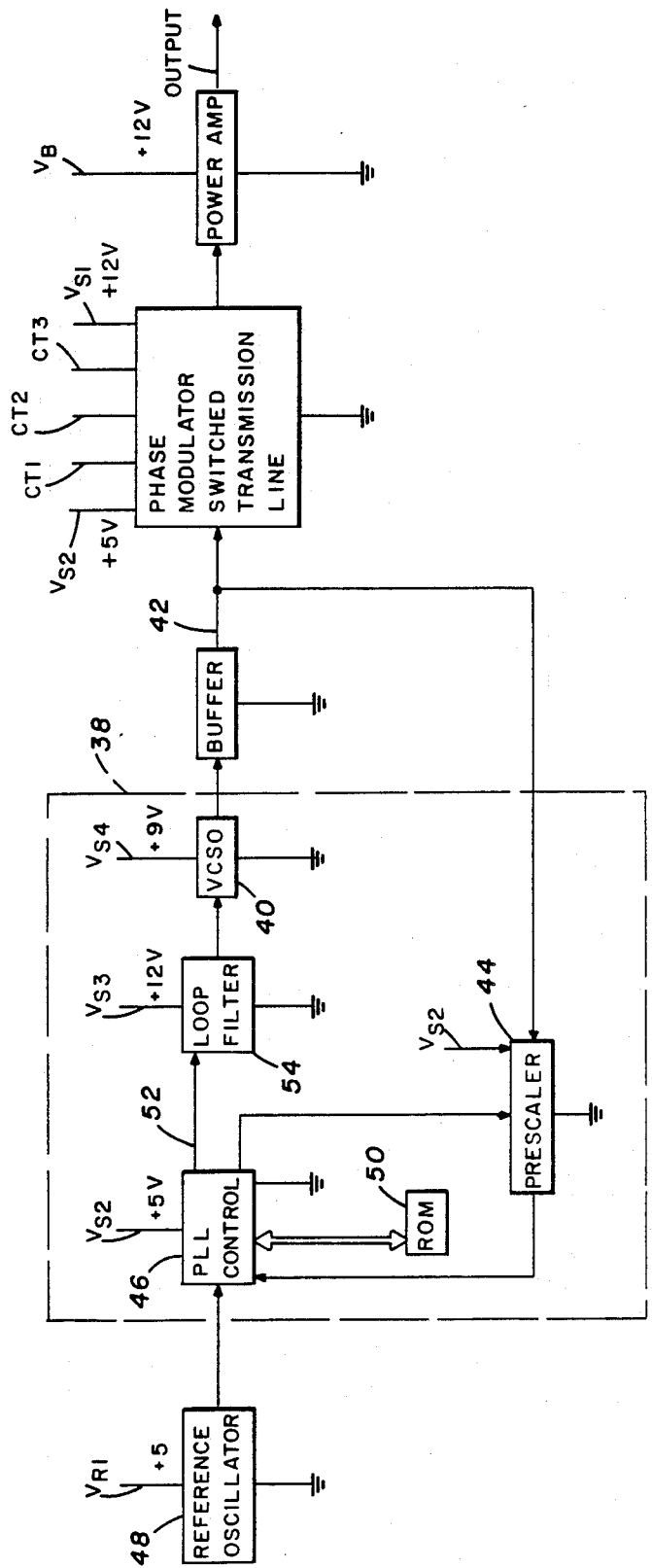
FIG. 2 is a block diagram of the present invention for use with the SARSAT search and rescue satellite system.

FIG. 2 is a block diagram of a search and rescue transmitter (ground transmitter) for use with the SARSAT satellite system, that employees the novel RF circuit. The RF circuit 38 generates a carrier at 406.025 MHz. The RF circuit operates similar to that discussed above with the voltage controlled SAW oscillator (VCSO) 40 providing the RF carrier output 42. A portion of the RF carrier output 42 is fed back to a prescaler 44 that provides a first frequency division function. This is necessary for two reasons: (1) because the rest of the phase lock loop control circuit is in CMOS integrated circuits that operate at lower frequencies; and, (2) to assist the frequency divide circuits in the PLL controller 46 to fine tune the frequency selections (i.e., this allows more flexibility in programming the division numbers since the prescaler 44 can shift between two division numbers under the control of the PLL controller 46). Output from prescaler 44 and reference oscillator 48 are inputted to the PLL Controller 46. The PLL Controller contains two frequency dividers and a phase comparator that operates similar to those shown in FIG. 1. The divide ratio number are stored in RAM 50 or down loaded by a microprocessor stored in the transmitter (not shown). The PLL Controller 46 provides a D.C. control signal 42 that inputs first to the loop filter 54 and then to the VCSO 40. In operation, the D.C. control signal is adjusted by the phase lock loop so that a stable RF carrier is outputted from the VCSO 40.

It is to be understood that the invented RF circuit can be implemented with discrete components, integrated circuits, and/or one or more custom chips. It is further to be understood that a variety of reference oscillators can be used with the RF circuit and that the RF circuit has broad applications and is not limited to the search and rescue environment. Obviously, many modifications and variations of the present invention are possible in light of the above teachings. It is, therefore, to be understood that within the scope of the appended claims the invention may be practiced otherwise when specifically described.

What is claimed is:

1. Circuit comprising:
   a voltage controlled SAW oscillator (VCSO) having a control voltage input and producing an RF output signal;
   a reference oscillator for producing an output having a frequency that is essentially temperature stable;
   a first frequency divider connected to the output of said voltage controlled SAW oscillator (VCSO) for providing an output divided in frequency by a first preselected value;
   a second frequency divider connected to the output of said reference oscillator for providing an output divided in frequency by a second preselected value; and,
   a phase comparator means for comparing the frequency and phase of the output from said first frequency divider with the frequency and phase of the output from said second frequency divider and adjusting the control voltage to said voltage controlled SAW oscillator (VCSO) until the divider output signals have the same frequency and phase, thereby maintaining the RF output signal produced by said SAW oscillator (VCSO) at a selected frequency.

2. The circuit of claim 1, wherein said phase lock loop means further comprises:
   a filter means operably coupled between the phase comparator means and the voltage controlled SAW oscillator (VCSO) for controlling the rate at which the control voltage to the voltage controlled SAW oscillator (VCSO) can be changed.

3. The circuit of claim 1, wherein said phase lock loop means further comprises:

a control means for controlling the divide ratio between said first and second frequency dividers, so as to adjust the frequency of the RF output signal.

4. The circuit of claim 3, wherein said control means is a microprocessor.

5. The circuit of claim 1, further including a memory means operably coupled to said first and second frequency divider for storing said first and second preselected values.

6. The circuit of claim 1, wherein said phase lock loop means further comprises a prescaler operably coupled between said voltage controlled SAW oscillator and said first frequency divider for further dividing the output frequency from said RF output.

* * * * *